United States Patent
Alvi et al.

(10) Patent No.: US 11,860,196 B2
(45) Date of Patent: Jan. 2, 2024

(54) DETECTION SYSTEM FOR DETECTING CAPACITANCE DEGRADATION IN INVERTERS

(71) Applicant: GM GLOBAL TECHNOLOGY OPERATIONS LLC, Detroit, MI (US)

(72) Inventors: Muhammad Hussain Alvi, Troy, MI (US); Chandra S. Namuduri, Troy, MI (US); Rashmi Prasad, Troy, MI (US); Renato Amorim Torres, Madison, WI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 33 days.

(21) Appl. No.: 17/540,081

(22) Filed: Dec. 1, 2021

(65) Prior Publication Data
US 2023/0168284 A1   Jun. 1, 2023

(51) Int. Cl.
*G01R 15/16* (2006.01)
*B60L 53/30* (2019.01)
*B60L 58/10* (2019.01)

(52) U.S. Cl.
CPC ............ *G01R 15/16* (2013.01); *B60L 53/305* (2019.02); *B60L 58/10* (2019.02); *B60L 2210/40* (2013.01)

(58) Field of Classification Search
None
See application file for complete search history.

(56) References Cited

U.S. PATENT DOCUMENTS

| | | | |
|---|---|---|---|
| 10,369,896 | B2 | 8/2019 | Namuduri et al. |
| 10,665,398 | B1 | 5/2020 | Namuduri et al. |
| 10,675,991 | B2 * | 6/2020 | Hu .......... H02J 7/0024 |
| 11,071,225 | B2 | 7/2021 | Namuduri et al. |
| 2021/0143811 | A1 | 5/2021 | Namuduri et al. |
| 2021/0286418 | A1 | 9/2021 | Namuduri et al. |

FOREIGN PATENT DOCUMENTS

CN     105785136 A   *   7/2016

OTHER PUBLICATIONS

English Translation of CN-105785136-A (Year: 2016).*
U.S. Appl. No. 16/915,296, filed Jun. 29, 2020, Prasad et al.
U.S. Appl. No. 17/153,455, filed Jan. 20, 2021, Alvi et al.

* cited by examiner

*Primary Examiner* — Douglas X Rodriguez

(57) ABSTRACT

A detection system for a capacitor of a power inverter of an electric vehicle includes a protection circuit including a current sensor and a power switch having a first terminal in communication with a battery system of the electric vehicle. The protection circuit is configured to selectively generate a pulse and to sense a measured current flowing through the power switch. A voltage sensor configured to sense a measured voltage across the capacitor. A controller in communication with the voltage sensor and the protection circuit is configured to estimate a capacitance value of the capacitor based on the measured current and the measured voltage.

20 Claims, 5 Drawing Sheets

DETECTION SYSTEM FOR DETECTING CAPACITANCE DEGRADATION IN INVERTERS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery systems of electric vehicles and more particularly to detection systems for detecting capacitance degradation in inverters of power control systems for battery systems of electric vehicles.

Battery electric vehicles (BEVs) include one or more battery packs each including one or more battery modules. Each of the battery modules includes one or more battery cells. A power control system is used to control charging and/or discharging of the battery packs during charging and/or driving. During driving, one or more electric motors of the BEV receive power from the battery system to provide propulsion for the vehicle and/or return power to the battery system during regeneration.

A power inverter module is arranged between the battery system and an electric motor for DC-AC conversion. The power inverter module includes a capacitor having a capacitance value, an equivalent series resistance (ESR) and an equivalent series inductance (ESL). During operation of the electric vehicle, the capacitor of the power inverter module may be subjected to high ambient temperatures, over voltage stress, excess ripple current, continuous charge/discharge cycles and/or humidity. These adverse conditions cause degradation of the capacitor. In other words, a capacitance value of the capacitor decreases and/or the ESR increases.

The capacitors are usually oversized to offset end-of-life degradation. Capacitor failure/degradation is one of the dominant failure modes as well as the cause of loss of performance of the inverter. Increasing ESR tends to increase heating of the capacitor, which further contributes to degradation.

SUMMARY

A detection system for a capacitor of a power inverter of an electric vehicle includes a protection circuit including a current sensor and a power switch having a first terminal in communication with a battery system of the electric vehicle. The protection circuit is configured to selectively generate a pulse and to sense a measured current flowing through the power switch. A voltage sensor configured to sense a measured voltage across the capacitor. A controller in communication with the voltage sensor and the protection circuit is configured to estimate a capacitance value of the capacitor based on the measured current and the measured voltage.

In other features, the protection circuit further includes a gate driver in communication with the controller and the power switch. The gate driver is isolated. The controller is configured to compare the capacitance value to a predetermined threshold and to alter at least one operating parameter of the electric vehicle when the capacitance value is less than the predetermined threshold. The at least one operating parameter of the electric vehicle includes reducing a maximum operating voltage of the power inverter. The at least one operating parameter of the electric vehicle includes increasing a minimum switching frequency of the power inverter.

In other features, the controller generates at least one of an audible or visual alarm in response to changes in the capacitance value. The controller calculates the capacitance value of the capacitor by integrating the measured current and dividing by the measured voltage. The controller calculates the capacitance value of the capacitor by taking an inverse of a change in the measured voltage between a first time and a second time divided by a difference between the first time and the second time.

In other features, the protection circuit is selected from a group consisting of a solid state relay and an efuse.

A detection system for a capacitor of a power inverter of an electric vehicle includes a first mechanical relay having a first terminal connected to a battery system and a second terminal connected to the power inverter. A precharge resistor includes a first terminal connected to the battery system and to the first terminal of the first mechanical relay. A second mechanical relay includes a first terminal connected to a second terminal of the precharge resistor and a second terminal connected to the second terminal of the first mechanical relay and the power inverter. A first voltage sensor includes a first terminal connected to the first terminal of the precharge resistor and a second terminal connected to the second terminal of the precharge resistor. The first voltage sensor is configured to sense a first measured voltage across the precharge resistor. A second voltage sensor is connected to first and second terminals of a capacitor connected to an input of the power inverter. The second voltage sensor is configured to sense a second measured voltage across the capacitor. A controller in communication with the first voltage sensor and second voltage sensor is configured to estimate a capacitance value of the capacitor based on the first measured voltage and the second measured voltage.

In other features, the controller alters at least one operating parameter of the electric vehicle in response to changes in the capacitance value. The at least one operating parameter of the electric vehicle includes reducing a maximum operating voltage of the power inverter. The at least one operating parameter of the electric vehicle includes increasing a minimum switching frequency of the power inverter.

In other features, the controller generates at least one of an audible or visual alarm in response to changes in the capacitance value. The controller calculates current through the precharge resistor and calculates the capacitance value of the capacitor by integrating the current and dividing by the second measured voltage. The controller calculates the capacitance value of the capacitor by taking an inverse of a change in the second measured voltage between a first time and a second time divided by a difference between the first time and the second time.

A non-transitory computer-readable medium storing instructions that, when executed by a controller, cause the controller to measure a capacitance value of a capacitor of a power inverter of an electric vehicle. The instructions include outputting a control signal to a protection circuit including a power switch and a current sensor, wherein the control signal causes the protection circuit to generate a pulse that is output to the capacitor. The instructions include receiving a measured current flowing through the power switch; receiving a measured voltage across the capacitor; and estimating a capacitance value of the capacitor based on the measured current and the measured voltage.

In other features, the instructions include altering at least one operating parameter of the electric vehicle in response to changes in the capacitance value.

In other features, the at least one operating parameter of the electric vehicle is selected from a group consisting of reducing a maximum operating voltage of the power inverter; and increasing a minimum switching frequency of the power inverter.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A detection system according to the present disclosure detects changes in capacitance values of one or more capacitors arranged at one or more DC inputs of one or more power inverters supplying vehicle loads such as a motor or other vehicle loads. While the following description relates to a power control system including a single DC capacitor and a single power inverter, the detection system can be used to detect changes in the total capacitance value of multiple capacitors and power inverters connected in parallel.

The detection system monitors changes in the capacitance value to diagnose degradation of the capacitor and to estimate the lifetime of the capacitor. The detection system may be implemented in power control systems using a solid state relay or efuse or power control systems using traditional precharge circuits and mechanical relays.

For example, pulse width modulation of a power switch in the solid-state relay or efuse is used to generate impulse currents that are output by the battery to the capacitor. Current measured by a current sensor in the solid-state relay or efuse is used to estimate a capacitance value of the capacitor and is used to detect early signs of failure of the capacitor and/or to alter one or more operating parameters of the inverter or vehicle in response to changes in the capacitance value.

Figure 1:
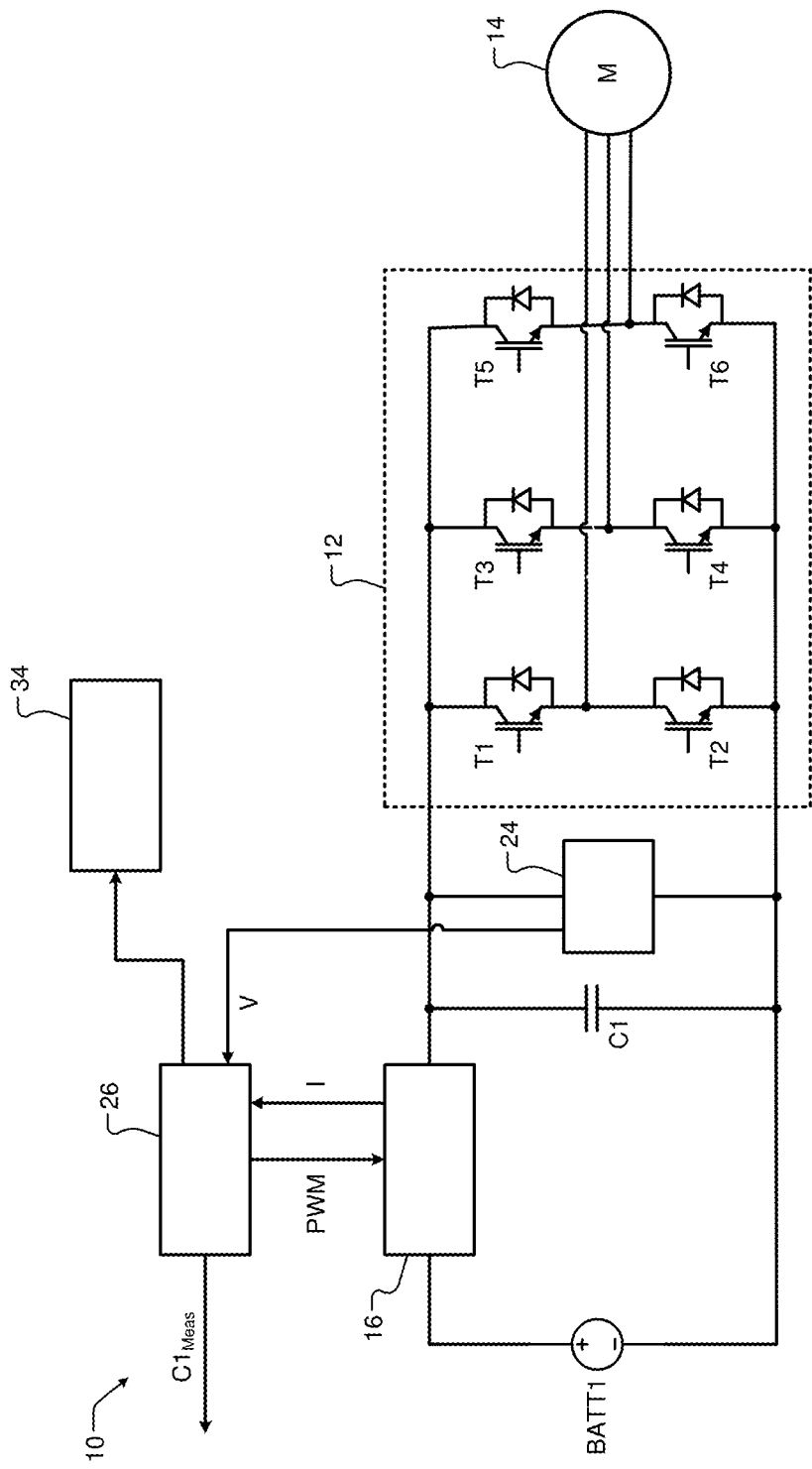
FIG. 1 is a functional block diagram and electrical schematic of an example of a detection system configured to detect degradation of a capacitor of a power inverter according to the present disclosure.

Referring now to FIG. 1, a detection system 10 detects changes in a capacitance value of a capacitor C1 that is connected across a DC input of a power inverter 12. As noted above, the detection system can also be used to detect changes in the total capacitance value of multiple capacitors and power inverters connected in parallel.

The power inverter 12 includes power switches T1, T2, T3, T4, T5 and T6. First terminals of power switches T1, T3 and T5 are connected to a first terminal of the capacitor C1. Second terminals of the power switches T1, T3 and T5 are connected to first, second and third phases of a motor 14, respectively, and to first terminals of the power switches T2, T4 and T6, respectively. Second terminals of the power switches T2, T4 and T6 are connected to a second terminal of the capacitor C1.

A battery system BATT1 includes one or more battery packs that are connected in series and/or parallel. Each of the battery packs includes one or more battery modules that are connected in series and/or parallel. Each of the battery modules includes one or more battery cells that are connected in series and/or parallel.

Power is supplied by the battery system BATT1 to the capacitor C1 and the power inverter 12 via a protection circuit 16. In some examples, a solid state relay is used and includes a gate driver, a transistor, a current sensor and/or other circuits. In other examples, an electronic fuse is used and includes a gate driver, a transistor, a current sensor and/or other circuits. A voltage sensor 24 sense a voltage across the capacitor C1.

During startup of the vehicle, a controller 26 selectively causes the protection circuit 16 to supply a current pulse for a predetermined period to the capacitor C1. In some examples, the power switch is turned on for a predetermined period in a range from 1 microseconds to 5 microseconds, although shorter or longer periods can be used. The pulse width is selected to keep the sensor error effects to minimum, perform quick capacitance check and minimize non-linearities.

In some examples, prior to supplying the current pulse, the controller 26 measures the current offset using the current sensor in the protection circuit 16. After sensing the current pulse, the controller 26 receives an output of the voltage sensor 24 and the current sensor in the protection circuit 16 and calculates the capacitance value of the capacitor C1. If the current offset is measured, compensation for the current is performed.

The controller 26 calculates the capacitance value of the capacitor C1 by integrating the measured current (I) over a predetermined period and dividing by the voltage V (or $C=\int Idt/V$). Alternately, the capacitance value can be calculated by taking current divided by the inverse of the change in voltage over a predetermined period (or $C=I/(dV/dt)$).

The controller 26 compares the measured capacitance to one or more thresholds and selectively alters operation of the power control system. In some examples, the measured capacitance is compared to multiple thresholds $TH_1$, $TH_2$, $TH_3$, etc. that are monotonically decreasing and the controller 26 takes different actions depending upon the particular threshold that is crossed.

For example, when the measured capacitance falls below a first threshold, a first action can be taken to alter the operation of the vehicle. When the measured capacitance falls below a second threshold (less than the first threshold), a second action (or the first and second actions) can be taken to alter the operation of the vehicle. When the measured capacitance falls below a third threshold (less than the second threshold), a third action (or the first, second and third actions) can be taken to alter the operation of the vehicle.

In other examples, a rate of change of the capacitance value is monitored over time and compared to a predetermined rate threshold. If the measured rate of change exceeds the predetermined rate threshold, another type of action can be taken to alter the operation of the vehicle. In still other examples, the lifetime of the capacitor is estimated based on the comparisons to the thresholds.

For example, the controller 26 may de-rate by reducing the maximum voltage and/or current that is output to the motor 14 (via the power inverter 12 and the capacitor C1). Alternately, the controller 26 may use a higher maximum frequency for switching of the power switch in the inverter since lower frequency switching tends to stress the capacitor C1 more than higher frequency switching via ripple. In other examples, the controller 26 may take other action such as illuminating a warning light, remotely contacting service via a telematics system 34, shutting the vehicle down, or taking other remedial actions.

Figure 2:
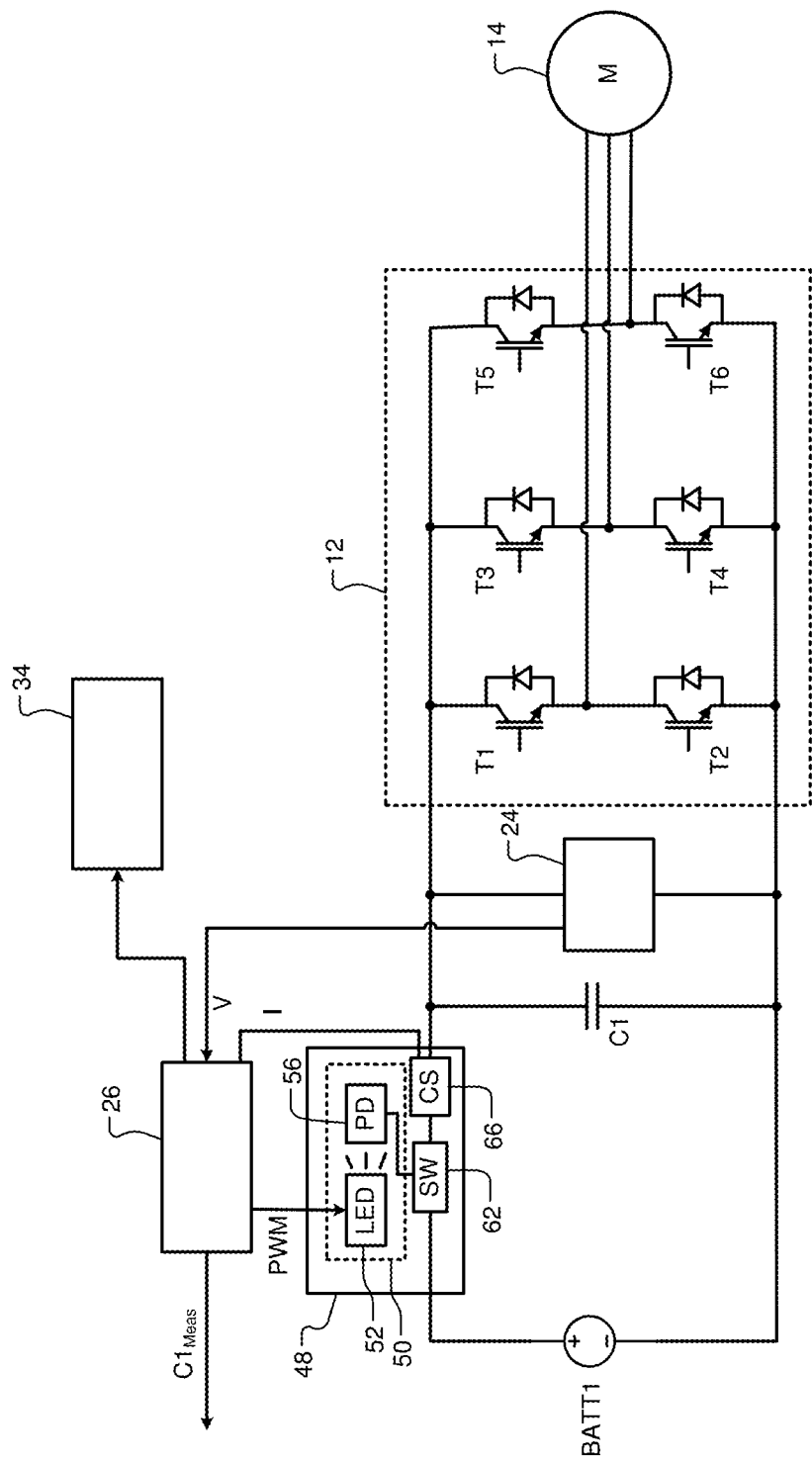
FIG. 2 is a functional block diagram and electrical schematic of another example of a detection system configured to detect degradation of a capacitor of a power inverter according to the present disclosure.

Referring now to FIG. 2, an example of a solid state relay 48 is shown to include a gate driver 50. In some examples, the gate driver 50 provides isolation and includes a light emitting diode (LED) 52 and a photodiode 56, although other types of isolating gate drivers can be used. The solid state relay 48 further includes a power switch 62 that includes a gate that is driven by the gate driver 50. In this example, the power switch 62 is driven by the output of the photodiode 56. A first terminal of the power switch 62 is connected to the battery system BATT1. A second terminal of the power switch 62 is connected to capacitor via a current sensor 66. In some examples, the current sensor 66 may include a Hall Effect sensor, although other types of current sensors such as a shunt resistor and voltage sensor or other type of current sensor can be used.

Figure 3A:
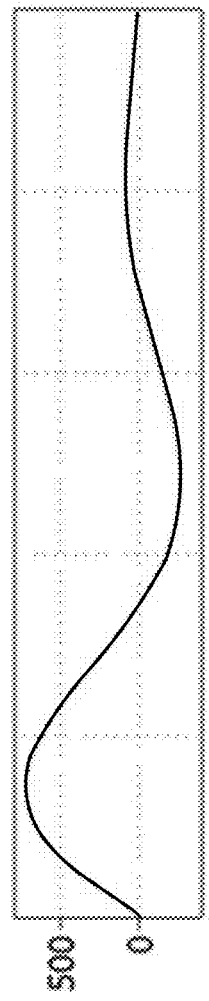
FIGS. 3A to 3D are graphs of simulated current, voltage, capacitor value, and turn on pulse as a function of time according to the present disclosure.
Figure 3B:
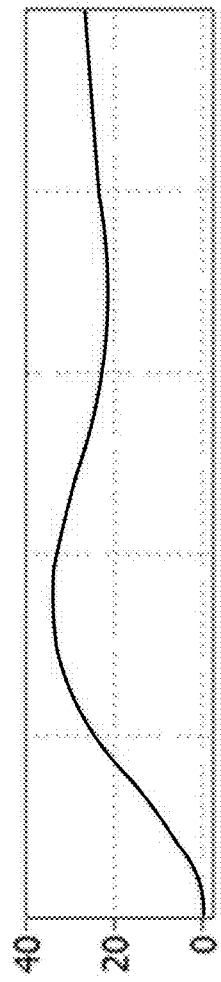
Figure 3C:
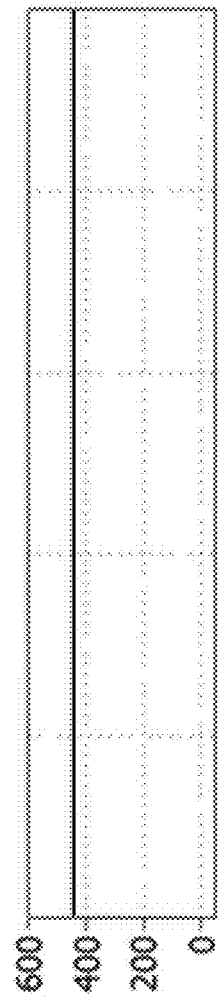
Figure 3D:
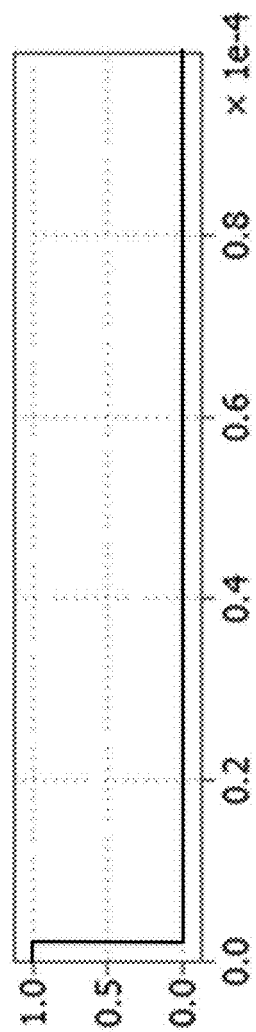

Referring now to FIGS. 3A to 3D, graphs of simulated current, voltage, capacitor value, and turn on pulse are shown as a function of time in a circuit with a solid state relay and a snubber circuit. In FIG. 3D, a turn-on pulse is generated by the controller. The turn-on pulse generates current into the capacitor C1 (FIG. 3A) and voltage across the capacitor C1 (FIG. 3B). The controller 26 calculates the capacitance value of the capacitor C1 (FIG. 3C) based thereon and selectively alters operation of the power inverter 12 based on the comparison with one or more thresholds as described above and below.

Figure 4:
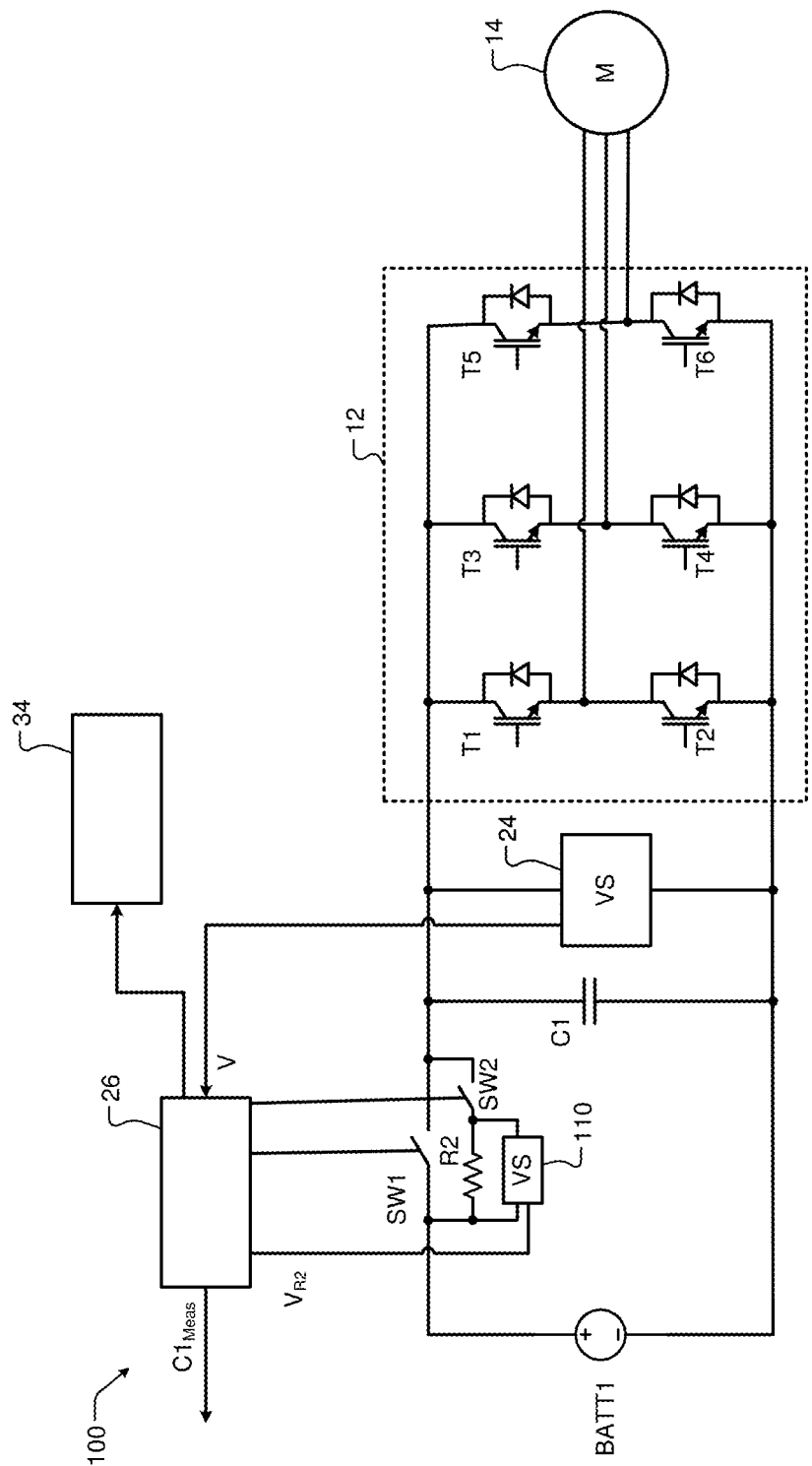
FIG. 4 is a functional block diagram and electrical schematic of another example of a detection system configured to detect degradation of a capacitor of a power inverter according to the present disclosure.

Referring now to FIG. 4, a detection system 100 includes mechanical relays SW1 and SW2 (instead of the solid-state relay or efuse that are shown above). The detection system 100 is configured to detect degradation of the capacitor C1 of the power inverter 12. A mechanical relay SW1 includes a first terminal connected to the battery system BATT1 and a second terminal connected to the power inverter 12.

A precharge resistor R2 has a first terminal connected to the battery system BATT1 and the first terminal of the mechanical relay SW1, a second terminal connecter to a first terminal of a mechanical relay SW2. A second terminal of the mechanical relay SW2 is connected to the power inverter 12 and the second terminal of the mechanical relay SW1. A voltage sensor 110 senses a voltage $V_{R2}$ across the precharge resistor R2. Since the resistance value of the resistor R2 is known, the current can be calculated. In some examples, the pulse is a first pulse of a group pre-charging pulses to precharge the capacitor C1.

In use, the voltage sensor 110 optionally determines the sensor offset current before the mechanical relay SW2 is closed. Then, the controller 26 closes the mechanical relay SW2 to output the current pulse and calculates the capacitance value of the capacitor C1 as described above.

Figure 5:
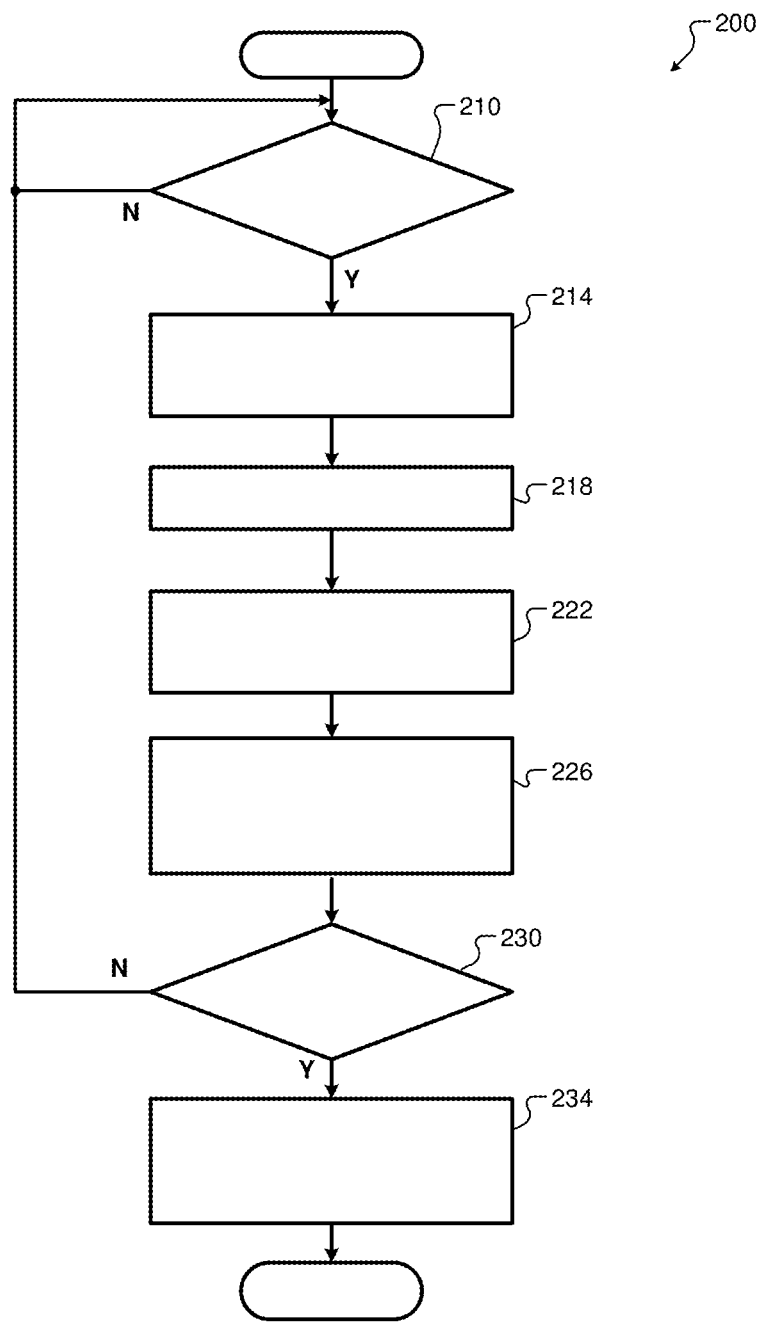
FIG. 5 is a flowchart of a method for detecting changes in the capacitance value of the capacitor of the power inverter according to the present disclosure.

Referring now to FIG. 5, a method 200 is shown for detecting changes in the capacitance value. At 210, the method determines whether the electric vehicle is being started. If 210 is true, the method optionally measures current offset. At 218, the method generates a current pulse having a predetermined period. At 222, the method measures the voltage and current. At 226, the method calculates the capacitance. In some examples, the method optionally adjusts for current offset.

At 230, the method compares the measured capacitance to a capacitance threshold. In some examples, one or more thresholds are used as described above. If 230 is true, the method adjusts an operating parameter of the electric vehicle as described above.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A detection system or a capacitor of a power inverter of an electric vehicle, comprising:
    a protection circuit including a current sensor and a power switch having a first terminal in communication with a battery system of the electric vehicle,
    wherein the protection circuit is configured to selectively generate a current pulse with the power switch that is supplied from the battery system and to the current sensor and the capacitor, and to sense a measured current flowing through the power switch;
    a voltage sensor configured to sense a measured voltage across the capacitor; and
    a controller in communication with the voltage sensor and the protection circuit and configured to estimate a capacitance value of the capacitor based on the measured current and the measured voltage.

2. The detection system of claim 1, wherein the protection circuit further includes a gate driver in communication with the controller and the power switch.

3. The detection system of claim 2, wherein the gate driver is isolated.

4. The detection system of claim 1, wherein the controller is configured to compare the capacitance value to a predetermined threshold and to alter at least one operating parameter of the electric vehicle when the capacitance value is less than the predetermined threshold.

5. The detection system of claim 4, wherein the at least one operating parameter of the electric vehicle includes reducing a maximum operating voltage of the power inverter.

6. The detection system of claim 4, wherein the at least one operating parameter of the electric vehicle includes increasing a minimum switching frequency of the power inverter.

7. The detection system of claim 1, wherein the controller is configured to generate at least one of an audible or visual alarm in response to changes in the capacitance value.

8. The detection system of claim 1, wherein the controller is configured to calculate the capacitance value of the capacitor by integrating the measured current and dividing by the measured voltage.

9. The detection system of claim 1, wherein the controller is configured to calculate the capacitance value of the capacitor by taking an inverse of a change in the measured voltage between a first time and a second time divided by a difference between the first time and the second time.

10. The detection system of claim 1, wherein the protection circuit is selected from a group consisting of a solid state relay and an efuse.

11. The detection system of claim 1, wherein the power switch includes a second terminal in communication with the capacitor.

12. The detection system of claim 11, wherein the second terminal of the power switch is in communication with the capacitor via the current sensor.

13. The detection system of Tim 1, wherein the controller is configured to measure a current offset using the current sensor prior to the protection circuit selectively generating the current pulse.

14. The detection system of claim 1, wherein the current pulse has a pulse width between one microsecond and five microseconds.

15. A non-transitory computer-readable medium storing instructions that, when executed by a controller, cause the controller to measure a capacitance value of a capacitor of a power inverter of an electric vehicle, comprising:
   outputting a control signal to a protection circuit including a power switch and a current sensor,
   wherein the control signal causes the protection circuit to generate a current pulse with the power switch that is output from a battery system of the electric vehicle to the capacitor;
   receiving a measured current flowing through the power switch;
   receiving a measured voltage across the capacitor; and
   estimating a capacitance value of the capacitor based on the measured current and the measured voltage.

16. The non-transitory computer-readable medium of claim 15, further comprising altering at least one operating parameter of the electric vehicle in response to changes in the capacitance value.

17. The non-transitory computer-readable medium of claim 16, wherein the at least one operating parameter of the electric vehicle is selected from a group consisting of:
   reducing a maximum operating voltage of the power inverter; and
   increasing a minimum switching frequency of the power inverter.

18. The non-transitory computer-readable medium of claim 15, wherein estimating the capacitance value of the capacitor includes calculating the capacitance value of the capacitor by integrating the measured current and dividing by the measured voltage.

19. The non-transitory computer-readable medium of claim 15, wherein estimating the capacitance value of the capacitor includes calculating the capacitance value of the capacitor by taking an inverse of a change in the measured voltage between a first time and a second time divided by a difference between the first time and the second time.

20. The non-transitory computer-readable medium of claim 15, further comprising generating at least one of an audible or visual alarm in response to changes in the capacitance value.

* * * * *